United States Patent [19]

Aswell et al.

[11] 4,387,503

[45] Jun. 14, 1983

[54] METHOD FOR PROGRAMMING CIRCUIT ELEMENTS IN INTEGRATED CIRCUITS

[75] Inventors: Cecil J. Aswell, Coppell; Hugh N. Chapman, Lewisville, both of Tex.

[73] Assignee: Mostek Corporation, Carrollton, Tex.

[21] Appl. No.: 292,512

[22] Filed: Aug. 13, 1981

[51] Int. Cl.³ .................. H01L 21/268; H01L 21/322
[52] U.S. Cl. ................................. 29/575; 29/576 B; 29/576 T; 29/577 C; 148/1.5; 148/191; 357/86
[58] Field of Search ............... 29/571, 575, 576 B, 29/576 T, 577, 577 C; 357/86, 91, 22, 29; 148/1.5, 191; 427/53.1

[56] References Cited

U.S. PATENT DOCUMENTS

| | | | |
|---|---|---|---|
| 3,206,340 | 9/1965 | Stelmak | 29/576 T |
| 3,539,880 | 11/1970 | Squire et al. | 29/575 X |
| 3,770,520 | 11/1973 | Kabaya et al. | 29/576 X |
| 3,865,651 | 2/1975 | Arita | 29/577 X |

OTHER PUBLICATIONS

Ohkura, M. et al., "Single Pulse Laser Annealing of a Double-Implanted Layer" in *Japanese J. of Applied Physics*, vol. 19, No. 2, Feb. 1980, pp. 183–186.

Tsu, R. et al., "Order-Disorder Transition . . . Laser Irradiation" in *Physical Review Letters*, vol. 12, No. 20, May 14, 1979, pp. 1356–1358.

*Primary Examiner*—L. Dewayne Rutledge
*Assistant Examiner*—Alan E. Schiavelli

[57] ABSTRACT

A laser programmable logic switch (22) includes a fusible link (28), an output node (26) and a transistor (24) which is fabricated to be in the off state. When it is desired to have the output node (26) at a low logic state, the circuit (22) is left unchanged. But if it is determined that the output node (26) should be at a high logic level state, the fusible link (28) is opened by a first laser pulse. A second laser pulse is then applied to transistor (24) to cause damage to the structure of the transistor (24). The transistor (24) can be damaged in any of a number of modes which result in the formation of a conducting path between the output node (26) and the power terminal $V_{cc}$. Unlike conventional laser switch circuits, the circuit (22) does not draw static power under any conditions thereby reducing power consumption by the integrated circuit utilizing such a laser switched gate. In a further embodiment a single transistor (90) fabricated in a nonconducting state is connected between first and second nodes (92, 94) but when damaged by a laser pulse the transistor (90) provides a low impedance connection between the nodes (92, 94). In a still further embodiment a transfer (110) is provided with a fusible link gate (110a), and is fabricated to be in an off state. A laser beam programs the transistor (110) by simultaneously opening the fusible link gate (110a) and altering the structure of the transistor to provide a low impedance path between the drain and source terminals thereof.

7 Claims, 13 Drawing Figures

METHOD FOR PROGRAMMING CIRCUIT ELEMENTS IN INTEGRATED CIRCUITS

TECHNICAL FIELD

The present invention pertains to the fabrication of integrated circuits and more particularly to the programming of circuit elements with the use of directed energy such as a laser pulse.

BACKGROUND OF THE INVENTION

In the manufacture of integrated circuits there is an increasing use of redundant circuit elements to increase the yield of good circuits. There is also a growing trend to customize standard integrated circuits after fabrication of the circuits. The integrated circuits manufactured for these purposes can include fusible links which are selectively opened after the circuit has been probe tested or its function has been determined.

In a conventional fuse link circuit, a control terminal in the integrated circuit is connected through a current limiting device to a first power terminal and at the same time connected through a fusible link to a second power terminal. The desired voltage state of the control terminal is selected by either opening or not opening the fusible link. This approach, however, results in a DC current flow through the current limiting device and the fusible link for those links which are not opened. This static power consumption can be a substantial problem for integrated circuits where power consumption is a critical parameter.

CMOS (complementary metal oxide semiconductor) circuits are particularly desirable because they can be designed to have low power consumption. However, this advantage is offset when conventional fusible links and current limiting devices are utilized to program the integrated circuit. Therefore, there exists a need for a method and apparatus for programming integrated circuits, particulary CMOS circuits, in which the static power consumption of the programmable elements is significantly reduced or eliminated.

SUMMARY OF THE INVENTION

A selected embodiment of the present invention comprises a method for programming an integrated circuit which includes the first step of directing an energy beam to open a link which is fabricated as an integral part of the integrated circuit to thereby disconnect an output node from a first power terminal of the integrated circuit. In a further step an energy beam is directed toward a transistor which is fabricated in the integrated circuit where the transistor is connected between the output node and a second power terminal. The transistor is fabricated to be in an off state. The energy beam damages the structure of the transistor such that there is produced therefrom a conducting path between the output node and the second power terminal. The overall integrated circuit is programmed by carrying out the above steps for selected fusible links and corresponding transistors in the integrated circuit.

In a further embodiment a transistor in a nonconducting state is connected between two nodes to provide a high impedance condition. The transistor is damaged by an energy beam, such as a laser pulse, to provide a low impedance connection between the nodes.

In a still further embodiment a transistor with a fusible link gate is fabricated on the integrated circuit with the transistor being in a nonconductive state. A single energy pulse opens the fusible link gate and renders the transistor conductive.

BRIEF DESCRIPTION OF THE DRAWINGS

For a more complete understanding of the present invention and the advantages thereof, reference is now made to the following description taken in conjunction with the accompanying drawings in which.

DETAILED DESCRIPTION

Figure 1:
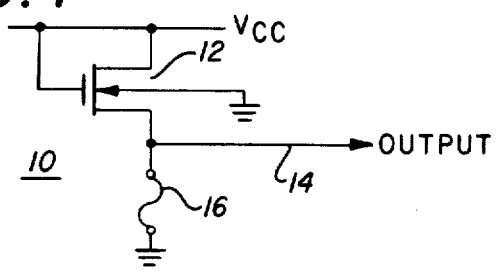
FIG. 1 is a schematic illustration of a conventional laser switched logic circuit.

A conventional laser switched logic gate is illustrated in FIG. 1. A logic gate 10 comprises an enhancement mode transistor 12 which has the gate and drain terminals connected to a first power terminal, $V_{cc}$, which is typically +5 volts. The source terminal of transistor 12 is connected to an output node 14. A fusible link 16, which is typically metal or polysilicon, is connected between node 14 and a second power terminal which serves as the circuit ground. The transistor 12 is partially conductive and functions essentially as a current limiting resistor.

In operation the circuit 10 provides a low level logic output at node 14 as long as the link 16 connects node 14 to ground. But if it should be determined that the output node should be driven to a high level logic state, the link 16 is opened by a laser pulse which disconnects node 14 from ground. Node 14 is then pulled to a high level logic state, $V_{cc}$, through the transistor 12.

A disadvantage of the circuit 10 is that when the link 16 is not opened, a DC current flow will pass through transistor 12 and link 16 thus producing static power consumption for the integrated circuit which includes the logic gate circuit 10. With a substantial number of such switched logic gates, the total static power consumption for the overall integrated circuit can be substantial. It is possible to use clocked circuitry with no static power dissipation but at the expense of reliability and complexity.

Integrated circuits are frequently fabricated using CMOS technology in order to have the lowest possible power consumption. The present invention provides a method and apparatus to enable MOS circuits to be selectively programmed by operation of laser pulse equipment while eliminating the static power consumption of conventional switched logic gates as illustrated in FIG. 1.

Figure 2:
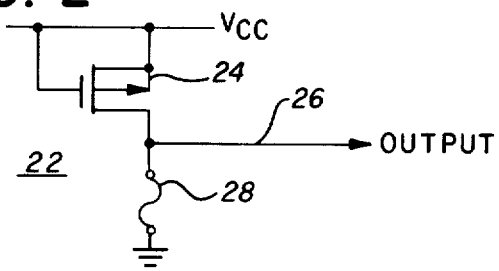
FIG. 2 is a schematic illustration of a low power laser switched logic circuit in accordance with the present invention.

Referring now to FIG. 2, there is illustrated a laser switched logic gate 22 which includes a p-channel, enhancement mode transistor 24. The source and gate terminals of transistor 24 are connected to a first power terminal $V_{cc}$. The drain terminal of transistor 24 is connected to an output node 26. A fusible link 28 is connected between outut node 26 and a second power terminal, circuit ground. The substrate on which circuit 22 is fabricated is connected to the positive supply $V_{cc}$. The connection of the transistor 24 as shown assures that the transistor 24 is affirmatively turned off.

The circuit 22 can have either a high or a low level logic output at node 26. In the condition that the circuit 22 is fabricated it provides a low level logic output since output node 26 is connected through link 28 to ground. Therefore, the output node 26 is held at ground. But, if it is determined that the output node 26 should be at a high level logic state, a first laser pulse is applied to open the link 28. A second laser pulse is then applied to transistor 24 with sufficient intensity to damage the transistor structure in such a way to establish a conducting path between the output node 26 and the first power terminal $V_{cc}$. A number of damage modes may be utilized to produce this result. These modes are described below.

Figure 3:
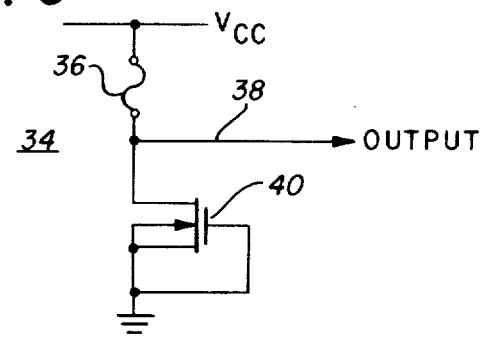
FIG. 3 is a schematic illustration of a further embodiment of a low power laser switched logic circuit in accordance with the present invention.

An optional switched logic gate circuit 34 is illustrated in FIG. 3. A fusible link 36 is connected between a first power terminal $V_{cc}$ and an output node 38. An n-channel, enhancement mode transistor 40 is connected between the output node 38 and ground. Specifically, the transistor 40 has the drain terminal thereof connected to the output node 38 and the gate and source terminals thereof connected to circuit ground. Transistor 40 is connected such that it is turned off. With link 36 intact the output node 38 is at a high logic state. If a low output logic state is desired, link 36 is opened by a laser pulse and a further laser pulse damages transistor 40 to form a relatively low impedance path between output node 38 and ground. This pulls the output node 38 to a low logic state.

Note that for FIG. 2, the integrated circuit substrate is connected to $V_{cc}$ while in FIG. 3, the substrate or well containing the transistor is connected to ground. This is indicated by the arrow configuration for the transistors 24 and 40.

Figure 5:
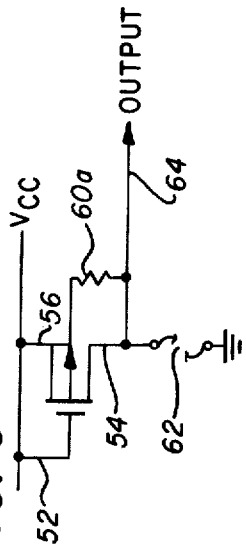
FIG. 5 is a schematic circuit illustrating the electrical equivalent of the transistor shown in FIG. 4.
Figure 7:
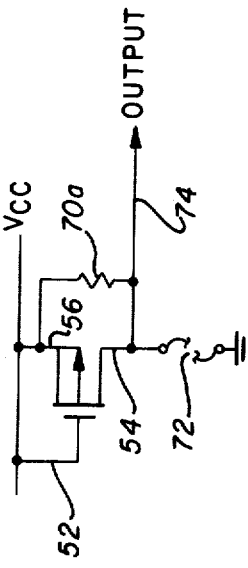
FIG. 7 is a schematic circuit illustrating the electrical equivalent of the transistor shown in FIG. 6.
Figure 9:
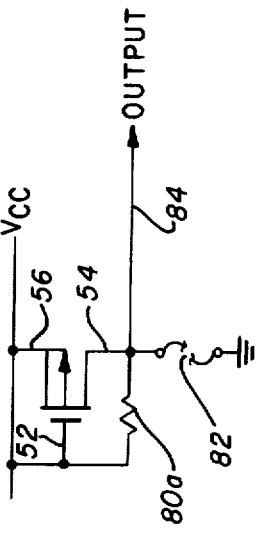
FIG. 9 is a schematic circuit illustrating the electrical equivalent to the transistor shown in FIG. 8.
Figure 4:
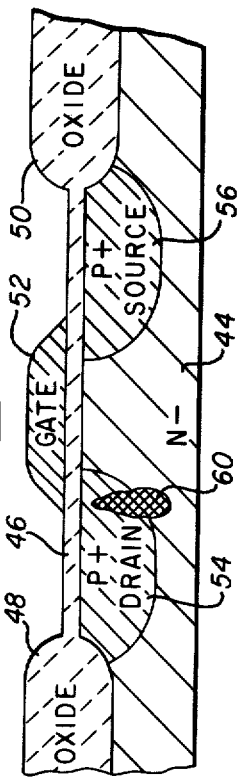
FIG. 4 is a sectional elevation view of a transistor in an integrated circuit showing a first mode of laser induced damage.
Figure 6:
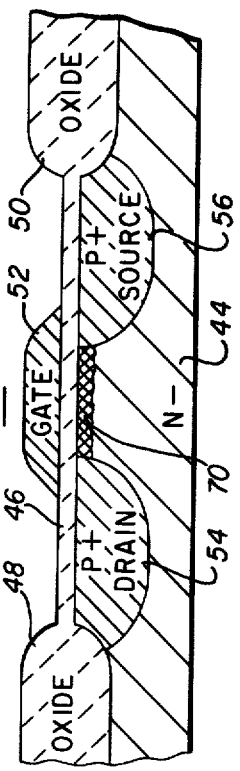
FIG. 6 is a sectional elevation view of a transistor in an integrated circuit showing a second mode of laser induced damage.
Figure 8:
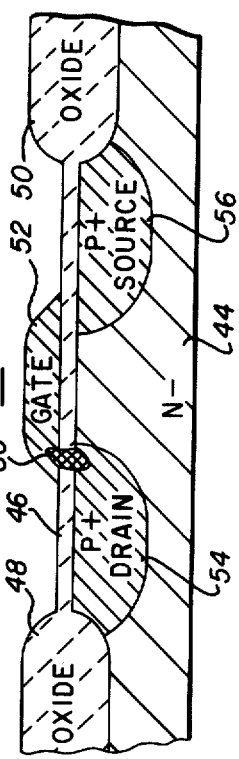
FIG. 8 is a sectional elevation view of a transistor in an integrated circuit showing a third mode of laser induced damage.

The various modes of structural damage which are performed on the transistor 24 to produce a low impedance path are illustrated in FIGS. 4, 6 and 8. The corresponding equivalent circuits are illustrated in FIGS. 5, 7 and 9. Similar damage mode effects apply to transistor 40 shown in FIG. 3.

Referring to FIGS. 4, 6 and 8 a transistor structure 42 is illustrated as a sectional view of an integrated circuit. The transistor 42 is fabricated on an N- substrate 44. A layer of gate oxide 46 is grown on the surface of the substrate 44. Field oxides 48 and 50 are grown on each of the sides of the gate oxide 46. A gate structure 52 is fabricated on the surface of the oxide 46 at essentially the center location between the field oxides 48 and 50. The gate structure 52 is typically polysilicon but can optionally be metal.

A P+ drain region 54 is implanted in the substrate 44 between the field oxide 48 and the gate structure 52. A P+ source region 56 is implanted in the substrate 44 between the field oxide 50 and the gate structure 52.

In FIGS. 5, 7 and 9, the corresponding gate, drain and source terminals are marked as shown in FIGS. 4, 6 and 8.

Referring now to FIG. 4, a pulse of laser energy is applied to the transistor structure 42 to produce a damaged region 60. Before the laser pulse is applied, the drain and substrate are made up of a well-organized crystal lattice with differential doping which produces a reversed biased junction between the substrate 44 and drain region 54. The laser pulse is applied to region 60 to damage the crystal lattice and destroy the PN junction between the drain region 54 and substrate 44. The damaged lattice region 60 functions electrically as a resistor. The region 60 thus acts as a conducting path between the substrate 44, which is connected to $V_{cc}$, and the drain terminal of the transistor structure 42. Note that the drain terminal 54 of the transistor in FIG. 5 is connected to an output terminal 64. Thus, the output terminal is effectively connected to the power terminal $V_{cc}$.

The electrical equivalent circuit to the transistor structure 42 shown in FIG. 4 is illustrated in FIG. 5. Note that in a previous step a link 62 has been opened by a laser pulse thereby disconnecting the output terminal 64 from the circuit ground. A resistor 60a is formed as a result of the damage in region 60 and is connected between $V_{cc}$ and the output terminal 64. The resistor 60a serves to pull the voltage at node 64 to the supply voltage $V_{cc}$.

A second damage mode is illustrated in FIG. 6. After the corresponding fusible link has been severed, the gate 52 and channel immediately thereunder are exposed to excessive heating which drives together the dopants from the drain region 54 and the source region 56. This is termed out-diffusion and is illustrated by the region 70. The doped region 70 serves as a conductive path between the regions 54 and 56. The heating which produces region 70 can be provided by a laser pulse.

FIG. 7 shows the equivalent circuit to the structure illustrated in FIG. 6. Note that a fusible link 72 has been opened to disconnect an output node 74 from the circuit ground. A resistor 70a is formed by the region 70 to produce a conductive path. The resistor 70a connects the drain and source terminals of the transistor which in turn connects the output node 74 to the supply voltage $V_{cc}$ thereby pulling the output node 74 to a high level logic state.

The third damage mode is illustrated in FIG. 8. A laser pulse is applied to break through the gate oxide layer 46 and connect the gate structure 52 to the drain region 54. The damage region is illustrated by the reference numeral 80.

Referring to FIG. 9, there is shown the electrical equivalent to the structure shown in FIG. 8. Note that a link 82 has been opened by a previous laser pulse to disconnect an output terminal 84 from the circuit ground. A resistor 80a is formed as a result of the oxide damage in the region 80. The resistor 80a is connected between the gate and drain terminals of the transistor. Since the gate and drain terminals are themselves connected to the power source $V_{cc}$ and the output node 84, the output node is thus pulled to a high level logic state.

Any of the three damage modes described above can be applied to either of the circuits shown in FIGS. 2 and 3. The fusible link can be opened before or after the damage is produced in the semiconductor structure. Further, one or more of the damage modes may be used at one transistor site.

Although the preferred method, as described, uses two distinct laser pulses, one to open the link and the other to damage the transistor, a suitable integrated circuit structure could be fabricated in which both functions are accomplished with a single laser pulse.

Application of a single laser pulse or a plurality of laser pulses is the desired method for causing the structural damage to the transistor and for opening the fusible link as described above, but it is understood that other forms of applied energy, such as light and electron beams for example, could be used to produce the same result.

Note that for the circuits 22 and 34 in FIGS. 2 and 3 that when the corresponding links are not broken there will be no DC current flow through the link since the corresponding transistors 24 and 40 are fabricated to be turned off. After the link is broken and the corresponding transistor suitably damaged, the output terminal will be connected through a resistor to either the first supply $V_{cc}$ or ground. The power consumption in this state can be limited by driving only gate terminals of transistors in the downstream circuitry.

Figure 10:
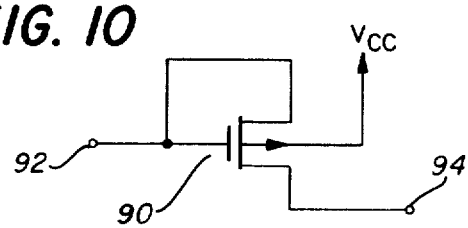
FIG. 10 is a schematic illustration of a laser activated node interconnect switch element.

A further application of the present invention is illustrated in FIG. 10. A P-channel transistor 90 has the gate and source terminals thereof connected to a node 92. The drain terminal is connected to a node 94. Transistor 90 is fabricated to be turned off thereby providing a very high impedance between nodes 92 and 94. Transistor 90 is selectively programmed to provide a high impedance or a low impedance between nodes 92 and 94. Transistor 90 is left as fabricated for a high impedance and is subjected to a laser pulse to produce damage as shown in FIG. 6 or FIG. 8 for a low impedance connection between nodes 92 and 94.

Figure 11:
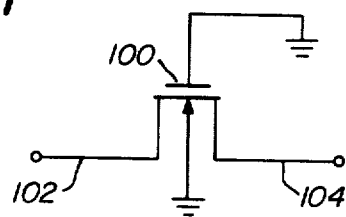
FIG. 11 is a schematic illustration of a laser programmed node interconnect switch element.

A further embodiment of the present invention is illustrated in FIG. 11. An N-channel transistor 100 has the source and drain terminals thereof connected between nodes 102 and 104. The gate terminal on transistor 100 is grounded. The well on which transistor 100 is fabricated is connected to the ground. In the configuration in which the transistor 100 is fabricated it is turned off thereby presenting a high impedance between nodes 102 and 104. If the transistor 100 is then subjected to a laser pulse to produce the damage as shown in FIG. 6 there will be out-diffusion between the source and drain regions to produce a conductive path between the source and drain terminals of the transistor 100. This in turn produces a low impedance path between the nodes 102 and 104. The circuit shown in FIG. 11 is used to selectively provide a path for transmitting a signal between nodes 102 and 104 or to block signal transmission between nodes 102 and 104.

In reference to the circuits shown in FIGS. 10 and 11 the transistors 90 and 100 may require fabrication to have a threshold voltage sufficiently large such that any signals applied to the input and output terminals cannot turn on the transistors.

Figure 12:
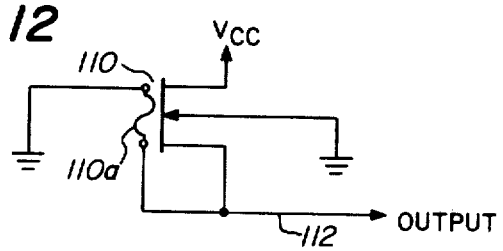
FIG. 12 is a schematic illustration of an N-channel MOS transistor having a fusible link gate.

A further embodiment of the present invention is illustrated in FIG. 12. A transistor 110 has a gate structure thereof fabricated to serve as a fusible link which is shown by the reference number 110a. A first terminal of the fusible link gate is connected to ground and a second terminal of the gate is connected to an output node 112. The source terminal of transistor 110 is connected to node 112 and the drain terminal of transistor 110 is connected to the power supply of $V_{cc}$. The well for transistor 110 is connected to ground. In the configuration in which transistor 110 is fabricated it is turned off and the output node 112 is a ground potential since it is connected to ground through the fusible link gate 110a. A single laser pulse can be applied to open the fusible link gate 110a which disconnects node 112 from ground and at the same time causes out-diffusion to produce a low impedance path between the drain and source terminals of transistor 110. This damage mode is illustrated in FIG. 6 above. Thus, the application of a single energy pulse can program a logic circuit which includes transistor 110 to have a high voltage state in place of the low voltage state which is produced when the transistor is fabricated.

Figure 13:
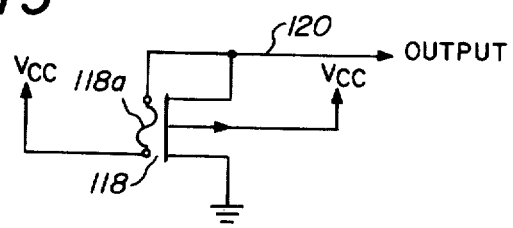
FIG. 13 is a schematic illustration of a P-channel MOS transistor having a fusible link gate.

A still further embodiment of the present invention is illustrated in FIG. 13. A P-channel transistor 118 is provided with a fusible link gate structure 118a. The substrate in which transistor 118 is fabricated is connected to the power supply of $V_{cc}$. The source terminal of transistor 118 is connected to a first terminal of the fusible link gate 118a and to an output node 120. The drain terminal of transistor 118 is connected to ground. The second terminal of the fusible link gate 118 is connected to the power supply $V_{cc}$. In the configuration in which the transistor 118 is fabricated the output node 120 is at a high voltage state since it is connected to the gate 118a to the power supply $V_{cc}$. In this condition the transistor 118 is turned off. The application of an appropriate laser beam pulse to the fusible link gate 118a causes the gate link to be opened and at the same time causes out-diffusion between the drain and source regions of transistor 118. As shown in FIG. 6 above this produces a low impedance path between the drain and source terminals of transistor 118 which in turn pulls the output node 120 to ground. Thus transistor 118 can be utilized to program a node to have either a high or low logical state.

The transistors illustrated in FIGS. 12 and 13 are fabricated in a conventional manner but have the gate structures accessible for use as fusible links. These transistors can be fabricated as shown in FIGS. 4, 6 and 8 with the gate structures being for example polysilicon or metal.

The immediate scope of interest for the present invention is to implement redundant elements in very large scale integration (VLSI) memory devices. However, the present invention is a basic circuit and technique which can be applied in the many applications which require laser programming. A further such application, for example, is for programmable logic arrays utilizing adaptive programming of circuit elements.

Although several embodiments of the invention have been illustrated in the accompanying drawings and described in the foregoing Detailed Description, it will be understood that the invention is not limited to the embodiments disclosed, but is capable of numerous rearrangements, modifications and substitutions without departing from the scope of the invention.

I claim:

1. A method for programming a logic switch in an integrated circuit, comprising the steps of:

directing an energy beam to open a link fabricated in said integrated circuit thereby disconnecting an output node from a first power terminal; and directing an energy beam toward a transistor fabricated in said integrated circuit, where said transistor is connected between said output node and a second power terminal and is normally turned off, to damage the structure of said transistor and produce therefrom a conducting path between said output node and said second power terminal.

2. The method recited in claim 1 wherein each of the steps of directing an energy beam comprises directing a laser pulse toward said integrated circuit.

3. The method recited in claim 1 wherein the step of directing an energy beam toward a transistor comprises the step of directing a laser beam at the drain region of said transistor to damage the crystal structure of the substrate of said integrated circuit and produce therefrom a low impedance path between said drain region and said substrate where the drain terminal of said transistor is connected to said output node and said substrate is connected to said second power terminal.

4. The method recited in claim 1 wherein the step of directing an energy beam toward a transistor comprises the step of directing a laser beam at the channel region of said transistor to cause out-diffusion of the dopants in the drain and source regions of said transistor and produce therefrom a low impedance path between said drain and source regions where the drain terminal of said transistor is connected to said output node and the source terminal of said transistor is connected to said second power terminal.

5. The method recited in claim 1 wherein the step of directing an energy beam toward a transistor comprises the step of directing a laser pulse at the gate region of said transistor to open the gate oxide of said transistor and produce a low impedance path between the gate and drain regions of said transistor where the drain terminal of said transistor is connected to said output node and the gate terminal of said transistor is connected to said second power terminal.

6. A method for programming a logic switch in an integrated circuit, comprising the steps of:

fabricating an MOS transistor having a first of the source and drain terminals thereof connected to a first power terminal and a second of the source and drain terminals thereof connected to an output node, said transistor having a gate which serves as a fusible link, a first terminal of said gate connected to said output node and a second terminal of said gate connected to a second power terminal, wherein said transistor is turned off and said output node is connected to said second power terminal, and directing an energy beam at said gate to open said gate and damage the structure of said transistor such that a low impedance path is created between said source and drain terminals thereby connecting said output node to said first power terminal.

7. The method recited in claim 6 wherein the step of directing an energy beam comprises directing a laser pulse toward said gate.

* * * * *